United States Patent
Jin et al.

(10) Patent No.: US 8,178,864 B2
(45) Date of Patent: May 15, 2012

(54) ASYMMETRIC BARRIER DIODE

(75) Inventors: Insik Jin, Eagan, MN (US); Wei Tian, Bloomington, MN (US); Venugopalan Vaithyanathan, Bloomington, MN (US); Cedric Bedoya, Edina, MN (US); Markus Siegert, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 127 days.

(21) Appl. No.: 12/272,912

(22) Filed: Nov. 18, 2008

(65) Prior Publication Data
US 2010/0123210 A1    May 20, 2010

(51) Int. Cl.
*H01L 29/861* (2006.01)
(52) U.S. Cl. .... 257/30; 257/109; 257/485; 257/E29.327
(58) Field of Classification Search ................. 257/109, 257/487, 485, E27.051, E29.327, E29.338, 257/E29.339
See application file for complete search history.

(56) References Cited

U.S. PATENT DOCUMENTS

| | | |
|---|---|---|
| 3,982,233 A | 9/1976 | Crookshanks |
| 3,982,235 A | 9/1976 | Bennett |
| 4,056,642 A | 11/1977 | Saxena |
| 4,110,488 A | 8/1978 | Risko |
| 4,160,988 A | 7/1979 | Russell |
| 4,232,057 A | 11/1980 | Ray |
| 4,247,915 A | 1/1981 | Bartlett |
| 4,323,589 A | 4/1982 | Ray |
| 4,576,829 A | 3/1986 | Kaganowicz |
| 4,901,132 A | 2/1990 | Kawano |
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |

(Continued)

FOREIGN PATENT DOCUMENTS
DE    102008026432    12/2009
(Continued)

OTHER PUBLICATIONS

U.S. Appl. No. 12/120,715, filed May 15, 2008, Inventors: Tian et al.
(Continued)

*Primary Examiner* — Jerome Jackson, Jr.
*Assistant Examiner* — David Spalla
(74) *Attorney, Agent, or Firm* — Mueting, Raasch & Gebhardt, P.A.

(57) ABSTRACT

A diode having a reference voltage electrode, a variable voltage electrode, and a diode material between the electrodes. The diode material is formed of at least one high-K dielectric material and has an asymmetric energy barrier between the reference voltage electrode and the variable voltage electrode, with the energy barrier having a relatively maximum energy barrier level proximate the reference voltage electrode and a minimum energy barrier level proximate the variable voltage electrode.

19 Claims, 4 Drawing Sheets

U.S. PATENT DOCUMENTS

| | | | |
|---|---|---|---|
| 5,923,948 | A | 7/1999 | Cathey, Jr. |
| 5,926,412 | A | 7/1999 | Evans |
| 5,929,477 | A | 7/1999 | McAllister |
| 6,011,281 | A | 1/2000 | Nunokawa |
| 6,013,548 | A | 1/2000 | Burns |
| 6,034,389 | A | 3/2000 | Burns |
| 6,077,745 | A | 6/2000 | Burns |
| 6,100,166 | A | 8/2000 | Sakaguchi |
| 6,114,211 | A | 9/2000 | Fulford |
| 6,121,642 | A | 9/2000 | Newns |
| 6,121,654 | A | 9/2000 | Likharev |
| 6,165,834 | A | 12/2000 | Agarwal |
| 6,300,205 | B1 | 10/2001 | Fulford |
| 6,341,085 | B1 | 1/2002 | Yamagami |
| 6,346,477 | B1 | 2/2002 | Koloyeros |
| 6,376,332 | B1 | 4/2002 | Yankagita |
| 6,448,840 | B2 | 9/2002 | Kao |
| 6,534,382 | B1 | 3/2003 | Sakaguchi |
| 6,617,642 | B1 | 9/2003 | Georgesca |
| 6,624,463 | B2 | 9/2003 | Kim |
| 6,653,704 | B1 | 11/2003 | Gurney |
| 6,667,900 | B2 | 12/2003 | Lowrey |
| 6,724,025 | B1 | 4/2004 | Takashima et al. |
| 6,750,540 | B2 | 6/2004 | Kim |
| 6,753,561 | B1 | 6/2004 | Rinerson |
| 6,757,842 | B2 | 6/2004 | Harari |
| 6,781,176 | B2 | 8/2004 | Ramesh |
| 6,789,689 | B1 | 9/2004 | Beale |
| 6,800,897 | B2 | 10/2004 | Baliga |
| 6,842,368 | B2 | 1/2005 | Hayakawa |
| 6,917,539 | B2 | 7/2005 | Rinerson |
| 6,940,742 | B2 | 9/2005 | Yamamura |
| 6,944,052 | B2 | 9/2005 | Subramanian |
| 6,979,863 | B2 | 12/2005 | Ryu |
| 7,009,877 | B1 | 3/2006 | Huai |
| 7,045,840 | B2 | 5/2006 | Tamai |
| 7,051,941 | B2 | 5/2006 | Yui |
| 7,052,941 | B2 | 5/2006 | Lee |
| 7,098,494 | B2 | 8/2006 | Pakala |
| 7,130,209 | B2 | 10/2006 | Reggiori |
| 7,161,861 | B2 | 1/2007 | Gogl |
| 7,180,140 | B1 | 2/2007 | Brisbin |
| 7,187,577 | B1 | 3/2007 | Wang |
| 7,190,616 | B2 | 3/2007 | Forbes |
| 7,200,036 | B2 | 4/2007 | Bessho |
| 7,215,568 | B2 | 5/2007 | Liaw |
| 7,218,550 | B2 | 5/2007 | Schwabe |
| 7,224,601 | B2 | 5/2007 | Panchula |
| 7,233,537 | B2 | 6/2007 | Tanizaki |
| 7,236,394 | B2 | 6/2007 | Chen |
| 7,247,570 | B2 | 7/2007 | Thomas |
| 7,272,034 | B1 | 9/2007 | Chen |
| 7,272,035 | B1 | 9/2007 | Chen |
| 7,273,638 | B2 | 9/2007 | Belyansky |
| 7,274,067 | B2 | 9/2007 | Forbes |
| 7,282,755 | B2 | 10/2007 | Pakala |
| 7,285,812 | B2 | 10/2007 | Tang |
| 7,286,395 | B2 | 10/2007 | Chen |
| 7,289,356 | B2 | 10/2007 | Diao |
| 7,345,912 | B2 | 3/2008 | Luo |
| 7,362,618 | B2 | 4/2008 | Harari |
| 7,378,702 | B2 | 5/2008 | Lee |
| 7,379,327 | B2 | 5/2008 | Chen |
| 7,381,595 | B2 | 6/2008 | Joshi |
| 7,382,024 | B2 | 6/2008 | Ito |
| 7,397,713 | B2 | 7/2008 | Harari |
| 7,413,480 | B2 | 8/2008 | Thomas |
| 7,414,908 | B2 | 8/2008 | Miyatake |
| 7,416,929 | B2 | 8/2008 | Mazzola |
| 7,432,574 | B2 | 10/2008 | Nakamura |
| 7,440,317 | B2 | 10/2008 | Bhattacharyya |
| 7,465,983 | B2 | 12/2008 | Eldridge et al. |
| 7,470,142 | B2 | 12/2008 | Lee |
| 7,470,598 | B2 | 12/2008 | Lee |
| 7,502,249 | B1 | 3/2009 | Ding |
| 7,515,457 | B2 | 4/2009 | Chen |
| 7,542,356 | B2 | 6/2009 | Lee |
| 7,646,629 | B2 | 1/2010 | Hamberg |
| 7,697,322 | B2 * | 4/2010 | Leuschner et al. ............ 365/158 |
| 7,738,279 | B2 | 6/2010 | Siesazeck |
| 7,738,881 | B2 | 6/2010 | Krumm |
| 7,829,875 | B2 * | 11/2010 | Scheuerlein ...................... 257/2 |
| 2001/0046154 | A1 | 11/2001 | Forbes |
| 2002/0081822 | A1 | 6/2002 | Yanageta |
| 2002/0136047 | A1 | 9/2002 | Scheuerlein |
| 2003/0045064 | A1 | 3/2003 | Kunikiyo |
| 2003/0049900 | A1 * | 3/2003 | Forbes et al. ................. 438/201 |
| 2003/0168684 | A1 | 9/2003 | Pan |
| 2004/0084725 | A1 | 5/2004 | Nishiwaki |
| 2004/0114413 | A1 | 6/2004 | Parkinson |
| 2004/0114438 | A1 | 6/2004 | Morimoto |
| 2004/0257878 | A1 | 12/2004 | Morikawa |
| 2004/0262635 | A1 | 12/2004 | Lee |
| 2005/0044703 | A1 | 3/2005 | Liu |
| 2005/0092526 | A1 | 5/2005 | Fielder |
| 2005/0122768 | A1 | 6/2005 | Fukumoto |
| 2005/0145947 | A1 | 7/2005 | Russ |
| 2005/0218521 | A1 | 10/2005 | Lee |
| 2005/0253143 | A1 | 11/2005 | Takaura |
| 2005/0280042 | A1 | 12/2005 | Lee |
| 2005/0280061 | A1 | 12/2005 | Lee |
| 2005/0280154 | A1 | 12/2005 | Lee |
| 2005/0280155 | A1 | 12/2005 | Lee |
| 2005/0280156 | A1 | 12/2005 | Lee |
| 2005/0282356 | A1 | 12/2005 | Lee |
| 2006/0073652 | A1 | 4/2006 | Pellizzer |
| 2006/0131554 | A1 | 6/2006 | Joung |
| 2006/0275962 | A1 | 12/2006 | Lee |
| 2007/0007536 | A1 | 1/2007 | Hidaka |
| 2007/0077694 | A1 | 4/2007 | Lee |
| 2007/0105241 | A1 | 5/2007 | Leuschner |
| 2007/0113884 | A1 | 5/2007 | Kensey |
| 2007/0115749 | A1 | 5/2007 | Gilbert |
| 2007/0253245 | A1 | 11/2007 | Ranjan |
| 2007/0279968 | A1 | 12/2007 | Luo |
| 2007/0281439 | A1 | 12/2007 | Bedell |
| 2007/0297223 | A1 | 12/2007 | Chen |
| 2008/0007993 | A1 | 1/2008 | Saitoh |
| 2008/0025083 | A1 | 1/2008 | Okhonin |
| 2008/0029782 | A1 | 2/2008 | Carpenter |
| 2008/0032463 | A1 | 2/2008 | Lee |
| 2008/0037314 | A1 | 2/2008 | Ueda |
| 2008/0038902 | A1 | 2/2008 | Lee |
| 2008/0048327 | A1 | 2/2008 | Lee |
| 2008/0094873 | A1 | 4/2008 | Lai |
| 2008/0108212 | A1 | 5/2008 | Moss |
| 2008/0144355 | A1 | 6/2008 | Boeve |
| 2008/0170432 | A1 | 7/2008 | Asao |
| 2008/0191312 | A1 | 8/2008 | Oh |
| 2008/0261380 | A1 | 10/2008 | Lee |
| 2008/0265360 | A1 | 10/2008 | Lee |
| 2008/0273380 | A1 | 11/2008 | Diao |
| 2008/0310213 | A1 | 12/2008 | Chen |
| 2008/0310219 | A1 | 12/2008 | Chen |
| 2009/0014719 | A1 | 1/2009 | Shimizu |
| 2009/0040855 | A1 | 2/2009 | Luo |
| 2009/0052225 | A1 | 2/2009 | Morimoto |
| 2009/0072246 | A1 | 3/2009 | Genrikh |
| 2009/0072279 | A1 | 3/2009 | Moselund |
| 2009/0161408 | A1 | 6/2009 | Tanigami |
| 2009/0162979 | A1 | 6/2009 | Yang |
| 2009/0185410 | A1 | 7/2009 | Huai |
| 2009/0296449 | A1 | 12/2009 | Slesazeck |
| 2010/0007344 | A1 | 1/2010 | Guo |
| 2010/0066435 | A1 * | 3/2010 | Siprak et al. ................. 327/530 |
| 2010/0067281 | A1 | 3/2010 | Xi |
| 2010/0078458 | A1 * | 4/2010 | Mottram et al. ............. 224/576 |
| 2010/0078758 | A1 * | 4/2010 | Sekar et al. .................. 257/530 |
| 2010/0110756 | A1 | 5/2010 | Khoury |
| 2010/0142256 | A1 | 6/2010 | Kumar |
| 2010/0149856 | A1 | 6/2010 | Tang |

FOREIGN PATENT DOCUMENTS

| | | |
|---|---|---|
| EP | 1329895 | 7/2003 |
| WO | WO 0062346 | 10/2000 |
| WO | WO 0215277 | 2/2002 |
| WO | WO 2005/124787 | 12/2005 |

| WO | WO 2006/100657 | 9/2006 |
| WO | WO 2007/100626 | 9/2007 |
| WO | WO 2007/128738 | 11/2007 |

OTHER PUBLICATIONS

Adee, S., "Quantum Tunneling Creates Fast Lane for Wireless", IEEE Spectrum, Oct. 2007.

Likharev, K., "Layered tunnel barrier for nonvolatile memory devices", Applied Physics Letters vol. 73, No. 15; Oct. 12, 1998.

Sayan, S., "Valence and conduction band offsets of a $ZrO_2/SiO_xN_y$/n-Si CMOS gate stack: A combined photoemission and inverse photoemission study", Phys. Stat. Sol. (b) 241, No. 10, pp. 2246-2252 (2004).

Internet website www.en.wikipedia.org/wiki/High-k dated Nov. 12, 2008.

Berger et al., Merged-Transistor Logic (MTL)—A Low-Cost Bipolar Logic Concept, Solid-State Circuits, IEEE Journal, vol. 7, Issue 5, pp. 340-346 (2003).

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al.
U.S. Appl. No. 12/498,661, filed Jul. 7, 2009, Inventor: Khoury.
U.S. Appl. No. 12/502,211, filed Jul. 13, 2009, Inventor: Lu.

Wang et al., Precision Control of Halo Implanation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

\* cited by examiner

ASYMMETRIC BARRIER DIODE

BACKGROUND

Many different types of memory devices are known for the storage of data. In selecting a memory device, the particular requirements for the data with which the memory device will be used are important. For example, several parameters such as the quantity of data, the required access time and the required storage time can play an influential role in memory device selection.

A memory device includes an array of memory cells with word lines extending along rows of the memory cells, and bit lines extending along columns of the memory cells. Memory cells are located at intersections of the word lines and bit lines. A memory cell can be connected to a semiconductor diode located between the memory cell and a substrate. The semiconductor diode prevents leakage currents from flowing between adjacent memory cells in the array. As smaller and smaller semiconductor elements are produced, problems arise due to their size. As the semiconductor diode becomes smaller, the thickness of the center insulating layer becomes sufficiently thin that electrodes can pass directly through the material, avoiding having to overcome the barrier energy of the insulator. This deters from the intent of having the diode present.

BRIEF SUMMARY

The present disclosure relates to diodes composed of band engineered dielectric materials that can be used as elective elements in memory arrays, for example, as replacements in some diode applications. Multiple layers of dielectric materials are selected to form an asymmetric energy barrier. Alternately, compositionally graded materials are used to form the asymmetric energy barrier.

In one particular embodiment, this disclosure provides a diode having a reference voltage electrode, a variable voltage electrode, and a diode material between the electrodes. The diode material is at least one high-K dielectric material and has an asymmetric energy barrier between the reference voltage electrode and the variable voltage electrode, with the energy barrier having a relatively maximum energy barrier level proximate the reference voltage electrode and a minimum energy barrier level proximate the variable voltage electrode.

These and various other features and advantages will be apparent from a reading of the following detailed description.

BRIEF DESCRIPTION OF THE DRAWING

The invention may be more completely understood in consideration of the following detailed description of various embodiments of the invention in connection with the accompanying drawing, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

Most modern diodes are based on semiconductor (silicon) p-n junctions. In a p-n diode, current can flow in only one direction, typically from the p-type side to the n-type side. Another type of semiconductor diode, the Schottky diode, utilizes a metal and a semiconductor rather than by a p-n junction. The unidirectionality of the current flow is based on the interface between the two materials (i.e., the p-type silicon and the n-type silicon, or the metal and semiconductor). The energy barrier for p-n diodes and for Schottky diodes, that is, the voltage needed for an electron to cross from one material to the other, is a symmetric barrier. The present disclosure is directed to semiconductor diodes that have an asymmetric energy barrier layer.

Figure 1A:
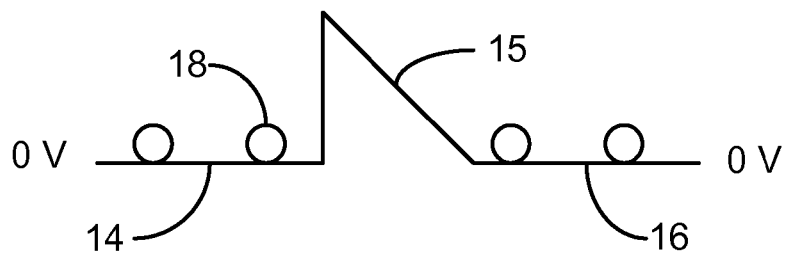
FIGS. 1A-1C are energy band edge diagrams for an asymmetric barrier, in FIG. 1A the bias=0, in FIG. 1B the bias=$V_0$, and in FIG. 1C the bias=$-V_0$.
Figure 1B:
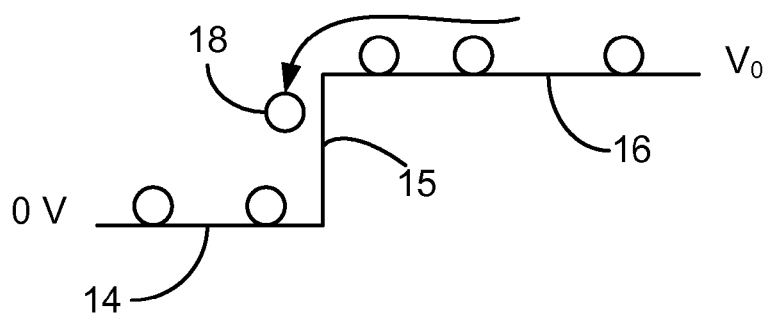
Figure 1C:
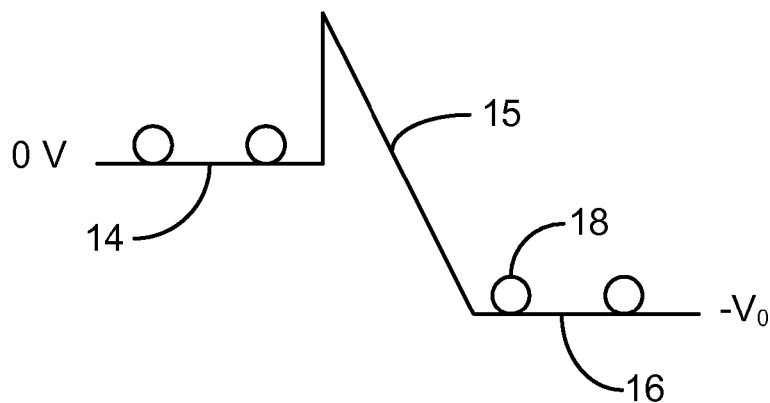

FIGS. 1A through 1C illustrate energy band edge diagrams for an asymmetric barrier diode. On a first side of the diode is a reference voltage region 14 and on the other side of the diode is a variable voltage region 16, which, in the illustrated embodiment, have equal energy. The diode energy barrier is labeled as 15. In FIG. 1A, the voltage bias is set to 0 V (zero). At this state, charge carriers 18 (e.g., electrons) are not able to pass across the energy barrier. In FIG. 1B the voltage bias is set to $V_0$, which allows charge carriers 18 to cross the energy barrier, in this illustration, moving from right to left in FIG. 1B. In FIG. 1C, the voltage bias is set to $-V_0$, in an attempt to have charge carriers 18 move in the direction opposite to when the voltage bias is $V_0$. The energy required for a charge carrier 18 to pass (e.g., tunnel) through an energy barrier is exponentially related to the negative of the barrier width times its height. Thus, as the width and/or height increase, the tunneling possibility decreases. An asymmetric energy barrier, according to this disclosure, is sufficiently high and sufficiently wide that charge carriers 18 are not able to cross or pass (e.g., tunnel) through the energy barrier.

The asymmetric energy barriers of this disclosure can form a diode, which can be used for selective elements in a memory array or other general circuits. The asymmetric barriers have a potential energy profile that has a pronounced peak at the reference voltage region and that decreases from the reference voltage region and to the variable voltage region. One type of asymmetric barrier diode according to this disclosure utilizes multiple layers of high-K dielectric materials selected to form an asymmetric barrier. The second type of asymmetric barrier diode according to this disclosure utilizes a compositionally graded high-K dielectric material comprising at least two materials to form the asymmetric barrier diode. Also disclosed are storage devices utilizing the asymmetric barriers.

The asymmetric barrier diodes of this disclosure utilize high-K dielectric materials. "High-K" materials have a high dielectric constant (K), as compared to silicon dioxide ($SiO_2$). Table 1 lists several high-k dielectric materials and their conduction band offset levels (CBO) with respect to silicon (Si), and their dielectric constant. The conduction band offset (CBO) measures the energy level difference between the conduction bands of Si and the high-K dielectric materials. This energy level difference provides an energy barrier for electrons to move from Si to high-k dielectric materials.

TABLE 1

| High-k dielectric materials | Conduction Band Offset | Dielectric Constant (K) |
|---|---|---|
| $Al_2O_3$ | 2.8 eV | 10-13 |
| $Si_3N_4$ | 2.4 eV | 6-7 |
| $LaAlO_3$ | 2.0 eV | 26 |
| $LaScO_3$ | 1.8 eV | 24 |
| $HfO_2$ | 1.5 eV | 22 |
| $ZrO_2$ | 1.4 eV | 19 |
| $Y_2O_3$ | 1.3 eV | 11 |
| $La_2O_3$ | 1.3 eV | 30 |
| $Ta_2O_5$ | 0.3 eV | 25 |
| $SrTiO_3$ | <0.1 eV | 100 |
| $SiO_2$ | 3.5 eV | 3.9 |

In accordance with this invention, a deliberately engineered diode of high-K dielectric materials can provide an asymmetric barrier diode with improved properties over previous diodes. The diode has a decreasing energy barrier from the reference voltage region (e.g., reference voltage region 14 of FIGS. 1A-1C) to the variable voltage region (e.g., variable voltage region 16 of FIGS. 1A-1C).

Figure 2:
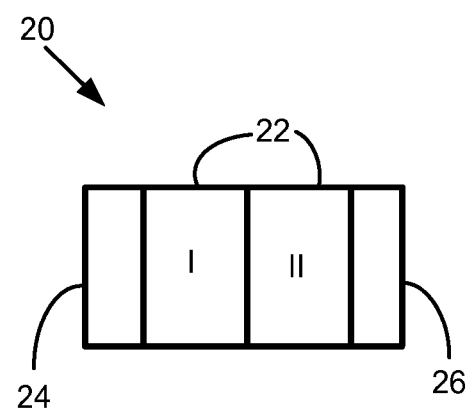
FIG. 2 is a schematic plan view of a multiple layered asymmetric diode according to this disclosure.

A first embodiment of an asymmetric barrier diode is illustrated in FIG. 2, which shows an asymmetric barrier diode 20 having a plurality of individual layers 22, in this embodiment two layers 22, arranged between a first electrode 24 and a second electrode 26. Layered asymmetric barrier diodes in accordance with this embodiment can have at least two individual layers, which includes at least three individual layers, at least four individual layers, and at least five individual layers. The thickness of asymmetric barrier diode 20 is less than about 200 Angstroms, in some embodiments less than about 100 Angstroms. The thickness of each layer 22 is usually about 2-50 Angstroms, and in some embodiments is about 10-20 Angstroms. When two layers 22 are present, an exemplary thickness for each layer 22 is about 20 Angstroms or less.

Asymmetric barrier diode 20 is composed of two different high-K dielectric materials. Each material of each individual layer 22 is identified with a Roman numeral (i.e., I, II). The two high-k dielectric materials are arranged to provide a stepped potential energy profile, which peaks or is highest at the reference voltage region (e.g., electrode 24) and is lowest at the variable voltage region (e.g., electrode 26).

Figure 3:
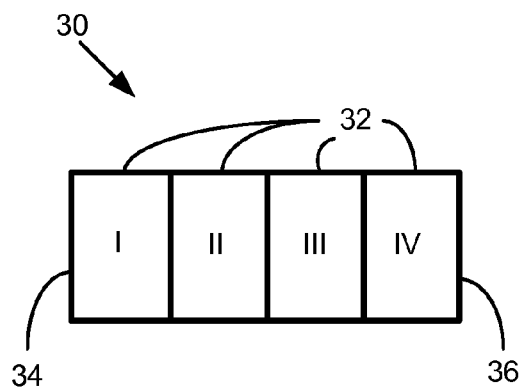
FIG. 3 is a schematic plan view of another embodiment of a multiple layered asymmetric diode according to this disclosure.
Figure 4:
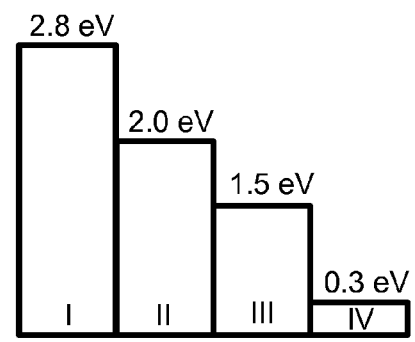
FIG. 4 is a graphical representation of the conduction band offset (in eV) for the asymmetric diode of FIG. 3.

Another embodiment for an asymmetric barrier diode is illustrated in FIGS. 3 and 4. FIG. 3 shows an asymmetric barrier diode 30 having a plurality of individual layers 32, arranged from a first end 34 of diode 30 to a second end 36 opposite first end 34. A metal layer (not illustrated), such as an electrode, is present proximate each end 34, 36. In the illustrated embodiment, asymmetric barrier diode 30 has four layers 32. Layered asymmetric barrier diodes in accordance with this disclosure have at least two individual layers, usually at least three individual layers, often at least four individual layers, and in some embodiments, at least five individual layers. The thickness of asymmetric barrier diode 30 is less than about 200 Angstroms, in some embodiments less than about 100 Angstroms. The thickness of each layer 32 is usually about 2-50 Angstroms, and in some embodiments is about 10-20 Angstroms. When four layers 32 are present, an exemplary thickness for each layer 32 is about 10 Angstroms or less. For asymmetric barrier diode 30 of FIGS. 3 and 4, each layer 32 has the same thickness (e.g., about 10 Å). In alternate embodiments, the individual layers may not have the same thickness.

Asymmetric barrier diode 30 is composed of four different high-K dielectric materials. Each material of each individual layer 32 is identified with a Roman numeral (i.e., I, II, III, IV) in FIGS. 3 and 4 indicating the material used for each layer. The high-k dielectric materials are selected and arranged in asymmetric barrier diode 30 based on their conduction band offset values; FIG. 4 illustrates four high-k dielectric materials, arranged with decreasing CBO values. The four high-k dielectric materials are arranged to provide a stepped potential energy profile, which peaks or is highest at the reference voltage region (e.g., region 14 of FIGS. 1A-1C) and is lowest at the variable voltage region (e.g., region 16 of FIGS. 1A-1C). The energy barrier shape resembles a right angle triangle.

Table 2 lists the high-k dielectric materials and their conduction band offset values for the schematic FIG. 4. Other embodiments of asymmetric barrier diodes having individual layers can use any high-K dielectric materials, not limited to those listed in Table 1.

TABLE 2

| Layer | Material | CBO |
|---|---|---|
| I | $Al_2O_3$ | 2.8 eV |
| II | $LaScO_3$ | 2.0 ev |
| III | $HfO_2$ | 1.5 eV |
| IV | $T_2O_5$ | 0.3 eV |

The material with the highest CBO is positioned at first end 34 (FIG. 3), for example proximate an electrode, at the reference voltage region, with subsequent adjacent layers decreasing in CBO to the second end 36 (FIG. 3). In alternate embodiments, the high-K dielectric material with the highest CBO may not be positioned at first end 34, but rather, may be displaced from end 34 by one or two layers. It is desired, however, that the material with the highest CBO be close to, if not adjacent, the reference voltage region or electrode.

Figure 5:
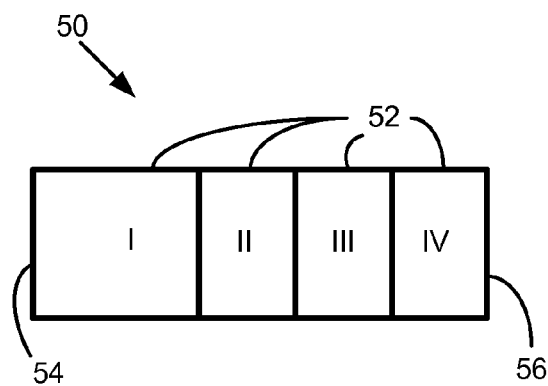
FIG. 5 is a schematic plan view of an alternate embodiment of a multiple layered asymmetric diode according to this disclosure.
Figure 6:
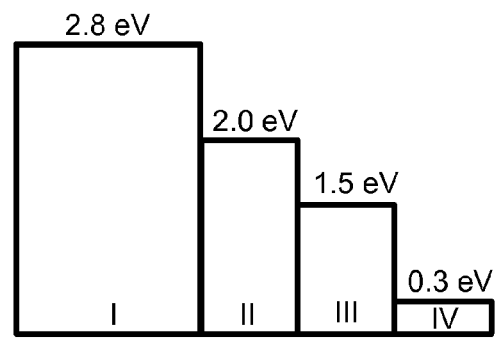
FIG. 6 is a graphical representation of the conduction band offset (in eV) for the asymmetric diode of FIG. 5.

An asymmetric barrier diode having layers of different thicknesses is illustrated in FIGS. 5 and 6. FIG. 5 shows an asymmetric barrier diode 50 having a plurality of individual layers 52, arranged from a first end 54 to a second end 56 opposite first end 54, with an electrode (not shown) present at each end 54, 56. Asymmetric barrier diode 50 has four layers 52 composed of four different high-K dielectric materials. Each material of each individual layer 52 is identified with a Roman numeral (i.e., I, II, III, IV) in FIGS. 5 and 6 indicating the material used for each layer; the high-k dielectric materials and their conduction band offset values for the schematic FIG. 6 are listed in Table 2.

Unlike asymmetric barrier diode 30 discussed above, asymmetric barrier diode 50 of FIGS. 5 and 6 has a layer having a different thickness than the other layers 32. In particular, layer 52 of material I, which has the highest CBO, is thicker than the other layers 52. For example, layer 52 of material I has a thickness about twice the thickness of the other layers 52, as an example, a thickness of about 20 Å compared to about 10 Å. In one exemplary embodiment, material I, having a thickness of about 20 Å, is crystalline $Al_2O_3$, which may be referred to as sapphire.

Figure 7A:
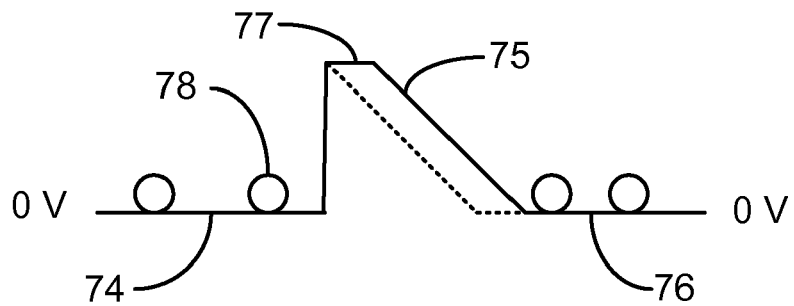
FIGS. 7A-7C are energy band edge diagrams for the asymmetric barrier of FIGS. 5 and 6, in FIG. 7A the bias=0, in FIG. 7B the bias=$V_0+V_k$, and in FIG. 7C the bias=$-V_0$.
Figure 7B:
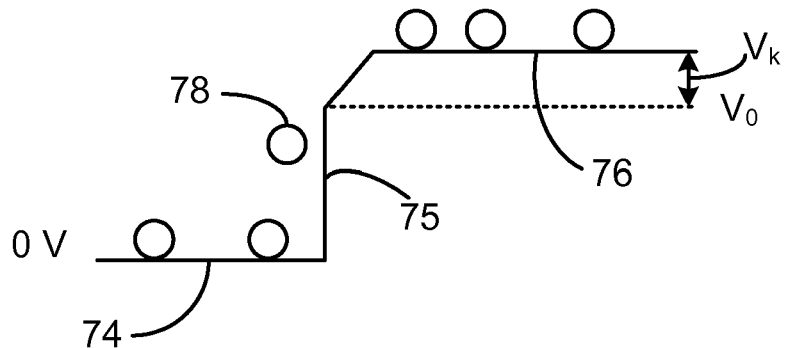
Figure 7C:
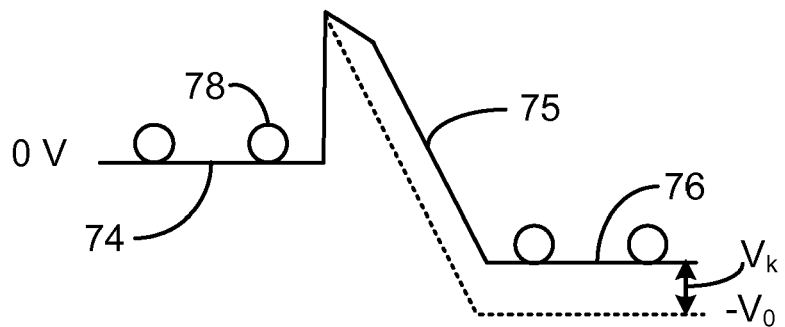

By utilizing a thicker layer as described in reference to asymmetric barrier diode 50 and FIGS. 5 and 6, the peak of the energy barrier is increased, as compared to if the layers were all similar. In FIGS. 7A through 7C, energy band edge diagrams for an asymmetric barrier diode having a thicker layer are illustrated and are compared to energy band diagrams of FIGS. 1A through 1C where the layers were the same thickness. In FIGS. 7A-7C, on a first side of the diode is a metallic reference voltage region 74 and on the other side of the diode is a metallic variable voltage region 76, which, in the illustrated embodiment, have equal energy when no voltage is applied. The diode energy barrier is labeled as 75, and has a plateau 77 proximate supply region 74, due to the thicker layer proximate first end 44 (FIG. 5). As a comparison, an energy barrier having all equal layers, such as for asymmetric barrier diode 30 of FIG. 3, is illustrated in phantom.

In FIG. 7A, the voltage bias is set to 0 V (zero). In FIG. 7B the voltage bias is set to $V_0+V_k$, which allows charge carriers 78 to cross the energy barrier, in this illustration, moving from right to left in FIG. 7B. $V_k$ represents the voltage difference resulting from the increased thickness of layer I compared to the other layers. In FIG. 7C, the voltage bias is set to $-V_0+V_k$, in an attempt to have charge carriers 78 move in the direction opposite to when the voltage bias is $V_0+V_k$. As described above, the energy required for an electron to pass (e.g., tunnel) through an energy barrier is exponentially related to the negative of the barrier width times its height. With the increased width of the asymmetric barrier diode, the tunneling possibility decreases.

Asymmetric barrier diode 20, 30, 50 having multiple individual layers 22, 32, 52 of material can be made by subsequent deposition of material using well-known thin film techniques such as chemical vapor deposition (CVD), physical vapor deposition (PVD), and atomic layer deposition (ALD). The high-K dielectric material being used, the thickness of the resulting layer 22, 32, 52, etc. will affect the preferred technique.

An energy barrier profile for a second type of asymmetric barrier diode is illustrated in FIG. 7. This second type of asymmetric barrier diode is similar to asymmetric barrier diodes 20, 30, 50, described above, in that they all have a decreasing energy barrier due to high-K dielectric material. This second type of asymmetric barrier diode, however, has a single layer of material that has a CBO that changes along its thickness, whereas for asymmetric barrier diodes 20, 30, 50 multiple and separate high-k dielectric materials are layered together.

Figure 8:
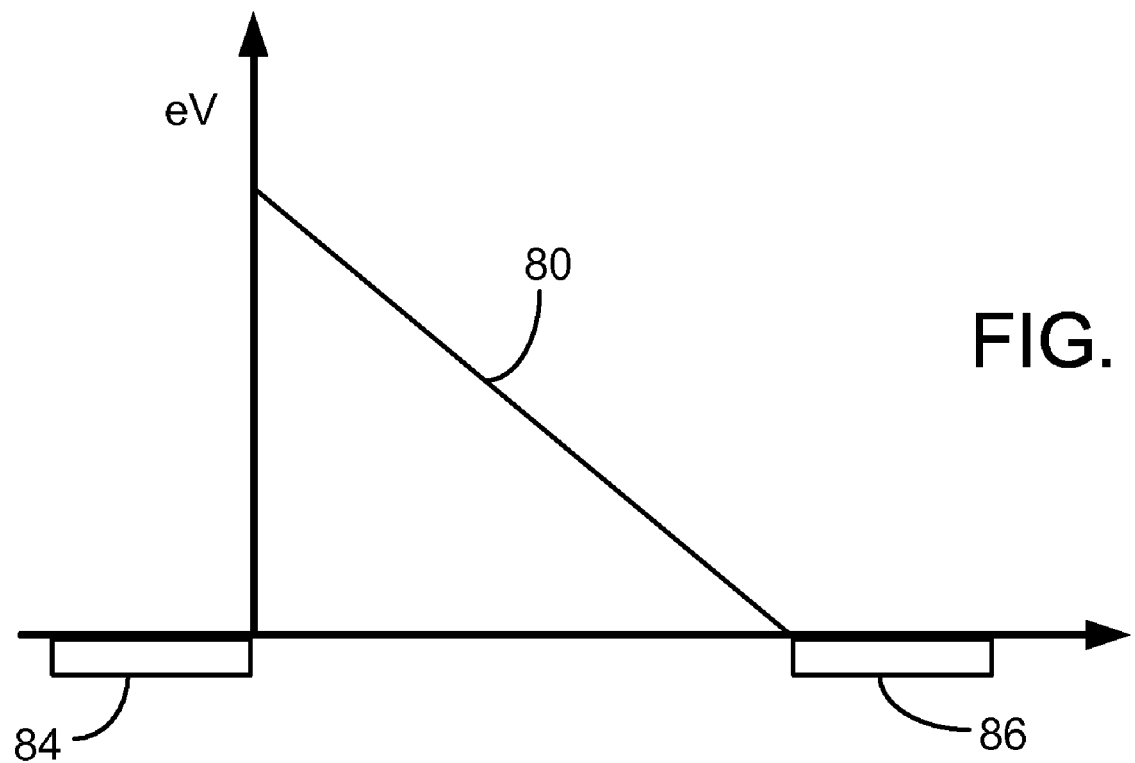
FIG. 8 is a graphical representation of the conduction band offset (in eV) for a third exemplary embodiment of an asymmetric diode according to this disclosure.

FIG. 8 illustrates an energy profile for an asymmetric barrier diode, represented by 80. On a first side of diode 80 is a metallic reference voltage region or electrode 84 and on the other side of the diode is a variable voltage region or electrode 86, which, in the illustrated embodiment, have equal energy. Diode 80 has a higher potential energy profile at reference voltage electrode 84 than at variable voltage electrode 86. In this embodiment, diode 80 is a single physical layer but is compositionally graded across its thickness.

The graded material of asymmetric barrier diode 80 can be formed by gradually changing the material being deposited during the forming process. For example, the high-K dielectric material may be oxidized at different levels during its deposition process in order to change its CBO level. Thus, at supply electrode 84, the diode material would be fully oxidized, providing the highest barrier energy whereas as storage electrode 86, the diode material would be least oxidized.

Figure 9:
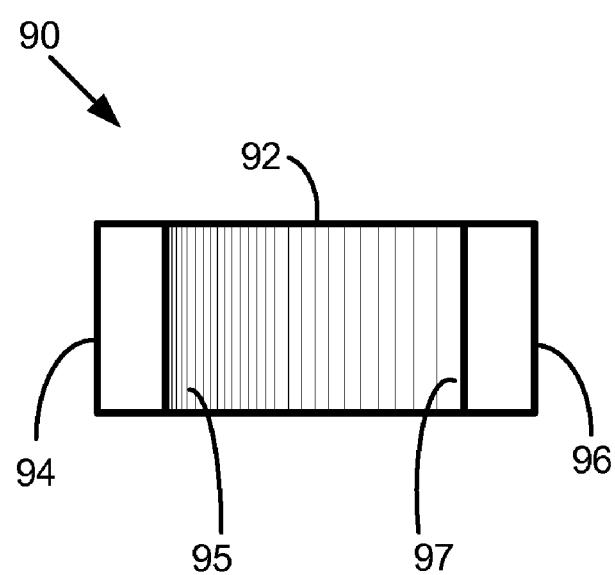
FIG. 9 is a schematic plan view of the asymmetric diode of FIG. 8.

Referring to FIG. 9, an element, such as a diode, is schematically illustrated as 90. Element 90 has a single layer of material 92 positioned between a reference voltage region or electrode 94 and a variable voltage region or electrode 96. Layer 92 has a more oxidized end 95 proximate reference voltage electrode 94 and a less oxidized end 97 proximate variable voltage electrode 96.

In a variant, two or more high-K dielectric materials can be combined to create the asymmetric energy profile having a peak. In this embodiment, the mole fraction of two high-k dielectric materials varies across the thickness of the layer. For example, to obtain the energy barrier illustrated in FIG. 8, two high-K dielectric materials are used, for example, $Ta_2O_5$ and $Al_2O_3$, present in the composition $(Ta_2O_5)_x(Al_2O_3)_{1-x}$, where x varies through the thickness of the layer. At the edges of the asymmetric layer proximate electrode 84, x=0 so that the composition is entirely $Al_2O_3$; at the edge proximate electrode 86, x=1 so that the composition is entirely $Ta_2O_5$. Other embodiments of asymmetric barrier diodes having a compositionally graded material can use any high-K dielectric materials, not limited to only $Ta_2O_5$ and $Al_2O_3$ or those listed in Table 1.

A compositionally graded asymmetric barrier layer, either with one or two high-K dielectric materials, can be made by thin film atomic sputtering.

In some embodiments, it may be desired to have an asymmetric barrier diode that is composed of both individual layers and compositionally graded high-K dielectric materials. For example, at least one of the layers of a layered asymmetric barrier diode could be a compositionally graded material.

Thus, embodiments of the ASYMMETRIC BARRIER DIODE are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A diode comprising:
   a reference voltage electrode;
   a variable voltage electrode; and
   a diode material dispersed between the reference voltage electrode and the variable voltage electrode, the diode material comprising at least three layers of high-K dielectric material and having an asymmetric energy barrier between the reference voltage electrode and the variable voltage electrode, the energy barrier having a relatively maximum energy barrier level located proximate the reference voltage electrode and a minimum energy barrier level located proximate the variable voltage electrode, the at least three layers positioned with the high-K dielectric material having the highest conduction band offset located proximate the reference voltage electrode and the high-k dielectric material having the lowest conduction band offset located proximate the variable voltage electrode.

2. The diode of claim 1 wherein the high-K dielectric material is least one of $Al_2O_3$, $HfO_2$, $LaScO_3$, $LaAlO_3$, $Y_2O_3$, $ZrO_2$, $La_2O_3$, $SrTiO_3$, $Ta_2O_5$, and $Si_3N_4$.

3. The diode of claim 1 wherein the high-K dielectric material having the highest conduction band offset is $Al_2O_3$.

4. The diode of claim 1 wherein the high-K dielectric material having the lowest conduction band offset is $Ta_2O_5$.

5. The diode of claim 1 comprising at least four layers of high-K dielectric material, the at least four layers positioned to provide a stepped potential energy profile with the high-K dielectric material having the highest conduction band offset located proximate the reference voltage electrode and the high-k dielectric material having the lowest conduction band offset located proximate the variable voltage electrode.

6. The diode of claim 5 wherein the high-K dielectric material having the highest conduction band offset is $Al_2O_3$.

7. The diode of claim 5 wherein the high-K dielectric material having the lowest conduction band offset is $Ta_2O_5$.

8. A diode comprising:
a reference voltage electrode;
a variable voltage electrode; and
a diode material dispersed between the reference voltage electrode and the variable voltage electrode, the diode material comprising a compositionally graded layer consisting of one high-K dielectric material oxidized at varying levels and having an asymmetric energy barrier between the reference voltage electrode and the variable voltage electrode, the energy barrier having a relatively maximum energy barrier level proximate the reference voltage electrode and a minimum energy barrier level proximate the variable voltage electrode.

9. The diode of claim 8 wherein the diode material is least one of $Al_2O_3$, $HfO_2$, $LaScO_3$, $LaAlO_3$, $Y_2O_3$, $ZrO_2$, $La_2O_3$, $SrTiO_3$, $Ta_2O_5$, and $Si_3N_4$.

10. An element comprising:
a reference voltage electrode;
a variable voltage electrode; and
a barrier layer between the reference voltage electrode and the variable voltage electrode, the barrier layer comprising an $Al_2O_3$ layer and at least two additional high-K dielectric material layers, with the $Al_2O_3$ and the high-K dielectric materials each having a conduction band offset, with the $Al_2O_3$ and the high-k dielectric materials positioned to have a stepped potential energy profile with a maximum at the reference voltage electrode and a minimum at the variable voltage electrode.

11. The element of claim 10 wherein the at least two high-K dielectric materials are selected from the group consisting of $HfO_2$, $LaScO_3$, $LaAlO_3$, $Y_2O_3$, $ZrO_2$, $La_2O_3$, $SrTiO_3$, $Ta_2O_5$, and $Si_3N_4$.

12. The element of claim 11 further comprising a third high-K dielectric material, the third high-K dielectric material being at least one of $HfO_2$, $LaScO_3$, $LaAlO_3$, $Y_2O_3$, $ZrO_2$, $La_2O_3$, $SrTiO_3$, $Ta_2O_5$, and $Si_3N_4$, with the $Al_2O_3$ and the high-K dielectric materials positioned to have a stepped potential energy profile.

13. The element of claim 12 wherein each of the layers has a thickness of about 20 Angstroms or less.

14. The element of claim 13 wherein one layer has a thickness of about 20 Angstroms and the other layers have a thickness of about 10 Angstroms.

15. The diode of claim 1, wherein each of the at least three layers has a thickness of about 20 Angstroms or less.

16. The diode of claim 1, wherein each of the at least three layers has a thickness of about 10 Angstroms or less.

17. The diode of claim 5, wherein each of the at least four layers has a thickness of about 20 Angstroms or less.

18. The diode of claim 5, wherein one layer has a thickness of about 20 Angstroms and the other layers have a thickness of about 10 Angstroms.

19. The diode of claim 5, wherein each of the at least four layers has a thickness of about 10 Angstroms or less.

* * * * *